United States Patent
Mangrum (10) Patent No.: US 10,490,487 B2
(45) Date of Patent: Nov. 26, 2019

(54) SEMICONDUCTOR PACKAGE HAVING INSPECTION STRUCTURE AND RELATED METHODS

(71) Applicant: Amkor Technology, Inc., Tempe, AZ (US)

(72) Inventor: Marc Alan Mangrum, Manchaca, TX (US)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 16/229,319

(22) Filed: Dec. 21, 2018

(65) Prior Publication Data

US 2019/0122964 A1    Apr. 25, 2019

Related U.S. Application Data

(62) Division of application No. 15/615,769, filed on Jun. 6, 2017, now Pat. No. 10,211,128.

(51) Int. Cl.
| | |
|---|---|
| H01L 23/49 | (2006.01) |
| H01L 23/495 | (2006.01) |
| H01L 23/40 | (2006.01) |
| H01L 21/02 | (2006.01) |

(52) U.S. Cl.
CPC ........ *H01L 23/49503* (2013.01); *H01L 21/02* (2013.01); *H01L 21/02491* (2013.01); *H01L 23/4093* (2013.01); *H01L 23/49513* (2013.01); *H01L 23/49524* (2013.01); *H01L 23/49575* (2013.01); *H01L 23/49548* (2013.01); *H01L 2224/32245* (2013.01); *H01L 2224/40245* (2013.01); *H01L 2924/181* (2013.01)

(58) Field of Classification Search
CPC ......... H01L 23/49513; H01L 23/49517; H01L 23/49565; H01L 23/49572

See application file for complete search history.

(56) References Cited

U.S. PATENT DOCUMENTS

| | | | |
|---|---|---|---|
| 4,994,412 | A | 2/1991 | Kalfus |
| 6,069,408 | A | 5/2000 | Honda |
| 6,455,348 | B1 | 9/2002 | Yamaguchi |
| 7,005,325 | B2 | 2/2006 | Chow |
| 9,184,117 | B2 | 11/2015 | Ho |
| 2007/0099349 | A1 | 5/2007 | Adachi |
| 2007/0298544 | A1 | 12/2007 | Oman |

(Continued)

*Primary Examiner* — Trang Q Tran
(74) *Attorney, Agent, or Firm* — Kevin B. Jackson (57) ABSTRACT

An electronic device structure includes a leadframe with a die pad and a lead. A semiconductor die is mounted adjacent to the die pad. A clip having a clip tail section is attached to the lead. The clip further has a clip top section attached to the clip tail section, and the clip top section is attached to a die top side of the semiconductor die with a conductive material. The clip further has an opening disposed to extend through the clip top section. In one embodiment, after a reflow step the conductive material forms a conductive fillet at least partially covering sidewall surfaces of the opening, and has a height within the opening with respect to a bottom surface of the clip top section. The opening and the conductive fillet provide an improved approach to monitoring coverage of the conductive material between the clip top section and the die top side of the semiconductor die.

20 Claims, 5 Drawing Sheets

(56) References Cited

U.S. PATENT DOCUMENTS

| | | |
|---|---|---|
| 2008/0067643 A1 | 3/2008 | Tanaka |
| 2011/0111562 A1 | 5/2011 | San Antonio |
| 2013/0001804 A1 | 1/2013 | Shimanuki |
| 2013/0037837 A1 | 2/2013 | Kang |
| 2013/0126988 A1 | 5/2013 | Lo |
| 2013/0181332 A1 | 7/2013 | Kelkar |
| 2013/0309816 A1 | 11/2013 | Xue |
| 2014/0191380 A1 | 7/2014 | Lee |
| 2014/0264797 A1 | 9/2014 | Ota |
| 2015/0102478 A1* | 4/2015 | Suthiwongsunthorn ............... H01L 24/45 257/680 |
| 2016/0308104 A1 | 10/2016 | Sasaoka |
| 2017/0033271 A1 | 2/2017 | Gruendl |
| 2017/0053871 A1* | 2/2017 | Nakajima ............ H01L 24/24 |

* cited by examiner

SEMICONDUCTOR PACKAGE HAVING INSPECTION STRUCTURE AND RELATED METHODS

CROSS-REFERENCE TO RELATED APPLICATIONS

The present application is a divisional application of co-pending U.S. patent application Ser. No. 15/615,769 filed on Jun. 6, 2017 and issued as U.S. Pat. No. 10,211,128 on Feb. 19, 2019, which is expressly incorporated by reference herein, and priority thereto is hereby claimed.

BACKGROUND OF THE DISCLOSURE

The present invention relates, in general, to electronics, and more particularly, to semiconductor packages, structures thereof, and methods of forming semiconductor packages.

In the past, packaged power semiconductor devices utilized various conductive interconnect techniques to electrically connect a power semiconductor die to conductive leads of a packaged device. In discrete power semiconductor devices, such as discrete insulated-gate field effect transistor (IGFET) semiconductor devices, manufacturers have utilized conductive ribbons and bonded wire or wirebond interconnects (including multiple wirebonds per electrode) for connecting current carrying electrodes on the power semiconductor device to the conductive leads of the package. However, these types of interconnects have not been able to provide sufficient current carrying capability as required in certain higher power devices.

As an alternative interconnect structure, manufacturers have used larger sized conductive clips as a replacement to ribbons and wirebonds to connect current carrying electrodes on the power semiconductor device to the conductive leads of the package. One problem with present semiconductor packages and methods using conductive clips is an insufficient ability to inspect conductive solder coverage between a main surface of the conductive clip and a main surface of the semiconductor die where the conductive clip is attached. In the past, manufacturers have used X-Ray examination after a solder reflow step to detect voiding defects; however, X-Ray examination is not sufficient for detecting other issues, such as actual solder coverage. Another past approach to address solder coverage for conductive clips has relied on process control methods, where trial and error has been used to characterize solder attach processes and to establish appropriate process windows. One problem with this approach is that it has had to rely on varying solder stencil thickness, evaluating different types of solder pastes, and varying the amount solder dispensed to establish the applicable process windows. Another problem with this approach is that it has required multiple process runs through assembly, which takes time and consumes materials, which adds costs. Further, this past approach has relied on X-Ray examination and electrical testing, but these approaches have not been able to detect every condition relevant to assuring optimum solder coverage.

Accordingly, it is desirable to have a structure and a method of forming a packaged semiconductor device that addresses the issues noted previously as well as others. It is also desirable for the structure and method to accommodate existing manufacturing flows and evaluation techniques.

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

For simplicity and clarity of the illustration, elements in the figures are not necessarily drawn to scale, and the same reference numbers in different figures denote the same elements. Additionally, descriptions and details of well-known steps and elements are omitted for simplicity of the description. As used herein, the term and/or includes any and all combinations of one or more of the associated listed items. In addition, the terminology used herein is for the purpose of describing particular embodiments only and is not intended to be limiting of the disclosure. As used herein, the singular forms are intended to include the plural forms as well, unless the context clearly indicates otherwise. It will be further understood that the terms comprises, comprising, includes, and/or including, when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures, or characteristics may be combined in any suitable manner, as would be apparent to one of ordinary skill in the art, in one or more embodiments. Additionally, the term while means a certain action occurs at least within some portion of a duration of the initiating action. Unless specified otherwise, spatially relative terms, such as beneath, under, bottom, below, lower, above, top, upper, and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as below or beneath other elements or features would then be oriented above the other elements or features. Thus, the exemplary term below can encompass both an orientation of above and below. The device may be otherwise oriented (rotated 90 degrees or at other orientations) and the spatially relative descriptors used herein may be interpreted accordingly. The use of word about, approximately or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. It is further understood that the embodiments illustrated and described hereinafter suitably may have embodiments and/or may be practiced in the absence of any element that is not specifically disclosed herein.

DETAILED DESCRIPTION OF THE DRAWINGS

The present description includes, among other features, a packaged electronic device or semiconductor package using a conductive leadframe and a conductive clip to electrically connected a semiconductor die to the leadframe. The conductive clip includes one or more inspection features or openings extending through a clip top section of the clip. During assembly, conductive material, such as solder paste, forms a conductive fillet or structure within the opening. The opening and the conductive fillet are adapted to facilitate automated inspection of the packaged electronic device to assess, for example, the sufficiency of conductive material coverage between the clip top section and the semiconductor die before the sub-assembly in encapsulated to form a package body. The structure and method improve, among other things, the reliability of packaged electronic devices and reduce manufacturing costs compared to prior approaches used to assess or control conductive material coverage.

In one embodiment, an electronic device structure includes a substrate comprising a die pad having die pad top surface and an opposing die pad bottom surface, a lead spaced apart from the die pad and having a lead top surface and an opposing lead bottom surface. A first semiconductor die comprises a first die top side, a first die bottom side mounted adjacent to the die pad top surface, and a first die sidewall, located between the first die top side and the first die bottom side, and defining a first die perimeter. A first clip comprises a first clip tail section connected to the lead, a first clip top section connected to the first clip tail section and attached to the die top side with a first conductive material, and a first opening disposed to extend through the first clip top section. The first conductive material extends upward or away from the first die top side to at least partially cover interior surfaces of the first opening such that the first conductive material has a first height within the first opening with respect to a bottom surface of the first clip top section.

In another embodiment, an electronic device structure includes a leadframe comprising a die pad having die pad top surface and an opposing die pad bottom surface, and a lead spaced apart from the die pad and having a lead top surface and an opposing lead bottom surface. A first semiconductor die comprises a first die first side, a first die second side mounted adjacent to the die pad top surface, and a first die sidewall, located between the first die first side and the first die second side, and defining a first die perimeter. A first clip comprises a first clip tail section coupled to the lead top surface, a first clip top section connected to the first clip tail section and connected to the first die first side with a first conductive material, and a first opening disposed to extend through the first clip top section, wherein the first conductive material forms a first conductive fillet at least partially covering sidewall surfaces of the first opening, and the first conductive fillet has a first height within the first opening with respect to a bottom surface of the first clip top section.

In a further embodiment, a method for forming an electronic device structure comprises mounting a first semiconductor die atop a die pad within a leadframe, wherein the leadframe further includes a lead. The method includes connecting a clip from the lead to a die top side of the first semiconductor die using a first conductive material. The method includes reflowing the first conductive material, wherein the first clip includes a first clip tail section connected to the lead, a first clip top section connected to the first clip tail section and connected to the die top side with the first conductive material, and a first opening disposed to extend through the first clip top section, wherein the first conductive material forms a first conductive fillet at least partially covering sidewall surfaces of the first opening; and the first conductive fillet has a first height within the first opening with respect to a bottom surface of the first clip top section.

Other examples and embodiments are further disclosed herein. Such examples and embodiments may be found in the figures, in the claims, and/or in the present disclosure.

Figure 1:
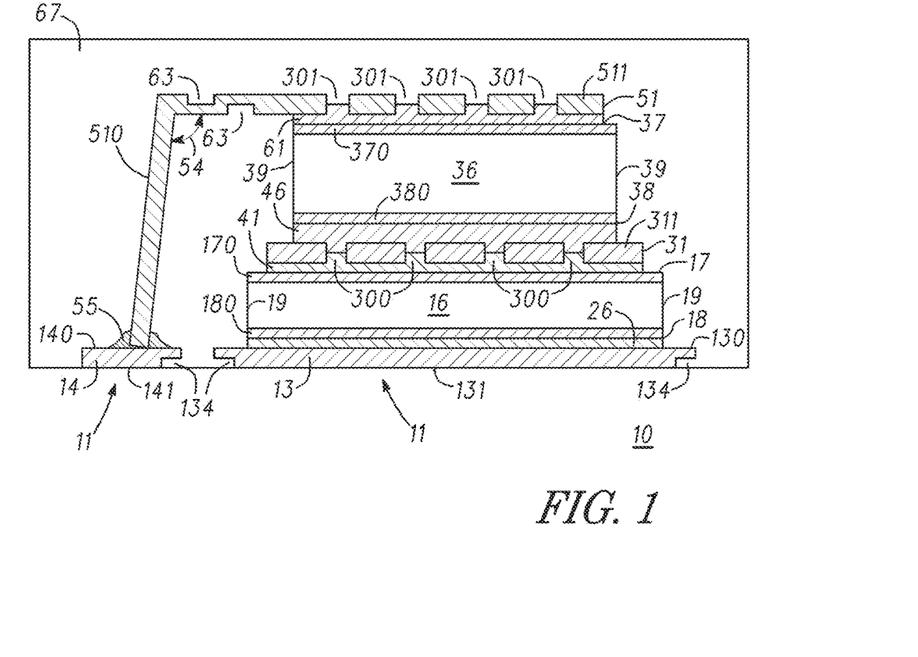
FIG. 1 illustrates a cross-sectional side view of an electronic component having an inspection feature in accordance with an embodiment of the present invention taken along reference line 1-1 of FIG. 2.
Figure 2:
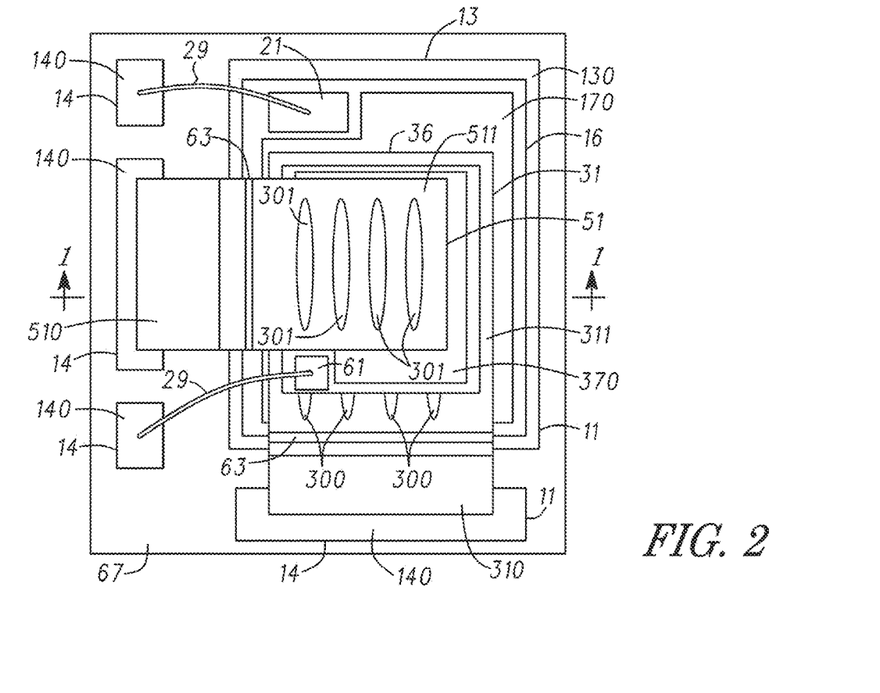
FIG. 2 illustrates a top plan view of the electronic component of FIG. 1.

Turning now to the drawings, FIG. 1 presents a cross-sectional side view of an electronic component 10, such as a semiconductor package 10, a semiconductor device 10 or a packaged semiconductor device 10, having inspection features 300 and 301 in accordance with an embodiment of the present description taken along reference line 1-1 of FIG. 2. FIG. 2 presents a top plan view of electronic component 10. In some embodiments, electronic component 10 comprises a semiconductor leadframe-based package configured, for example, for high-power and/or high-current requirements.

As presented in FIGS. 1 and 2, electronic component 10 includes a substrate 11, such as a leadframe 11 having a die pad 13 and one or more leads 14 spaced apart from die pad 13. Die pad 13 has a die pad top surface 130 and an opposing die pad bottom surface 131. In addition, each lead 14 has a lead top surface 140 and an opposing lead bottom surface 141. In some embodiments, leadframe 11 comprises a conductive material. In some embodiments, leadframe 11 is a copper-based leadframe (for example, a leadframe comprising copper/iron/phosphorous; 99.8/0.01/0.025), a copper alloy-based leadframe (for example, a leadframe comprising copper/chromium/tin/zinc; 99.0/0.25/0.22), or an alloy 42-based leadframe (for example, a leadframe comprising iron/nickel; 58.0/42.0). In other embodiments, leadframe 11 can comprise other conductive or non-conductive materials, which may be further plated (in whole or in part) with one or more conductive layers.

An electronic die 16, such as a semiconductor die 16 or a semiconductor device 16 is mounted adjacent to or atop die pad top surface 130 of die pad 13. In one embodiment, semiconductor die 16 is mounted or attached to die pad 13 using conductive attach layer 26, which can be a conductive solder, a conductive adhesive, or other materials as known to those skilled in the art. In one embodiment, semiconductor die 16 includes a die top side 17, an opposing die bottom side 18, and a die sidewall 19 located between die top side 17 and die bottom side 18. In the present embodiment, die sidewall 19 defines a die perimeter for semiconductor die 16. In some embodiments, die top side 17 can be defined by a conductive layer 170. In other embodiments, die top side 17 can be defined by one or more dielectric layers and one or more conductive layers, which are interconnected to device regions (not shown) disposed within and/or on semiconductor die 16. In some embodiments, die bottom side 18 can be defined by a conductive layer 180. In some embodiments, semiconductor die 16 can be a power semiconductor device, such as an insulated gate field effect transistor (IGFET) device, an insulated gate bipolar transistor (IGBT) device, a bipolar transistor device, a diode device, other power devices, or other semiconductor devices as known to those skilled in the art. In the present embodiment, semiconductor die 16 is illustrated as an IGFET device and further includes a control electrode 21 electrically connected to a lead 14 using a conductive connective structure 29, such as a conductive wire 29 (illustrated, for example, in FIG. 2).

A clip 31 is attached adjacent to, atop, or to die top side 17 of semiconductor die 16 using a conductive material 41 or a conductive layer 41. In some embodiments, conductive material 41 is a conductive solder, such as a solder paste, which can be a blend of micro-fine spherical solder powder, flux, and a binder. Clip 31 includes a clip tail section 310 and a clip top section 311 connected to clip tail section 310. In most embodiments, clip tail section 310 extends away from clip top section 311 at a selected bend angle for connecting clip tail section 310 to at least one of leads 14 as illustrated in FIG. 2. In accordance with the present embodiment, clip 31 includes one or more inspection features 300, openings 300, or inspection ports 300 disposed to extend completely through clip top section 311 such that conductive material 41 can be monitored, viewed, or inspected through the inspection features 300.

In one embodiment, electronic component 10 further includes an electronic die 36, such as a semiconductor die 36 or a semiconductor device 36, which is mounted adjacent to or atop clip top section 311. In one embodiment, semiconductor die 36 is mounted or attached to clip top section 311 using conductive attach layer 46, which can be a conductive solder, a conductive adhesive, or other materials as known to those skilled in the art. In accordance with the present embodiment, conductive attach layer 46 covers and overlaps at least portions of clip top section 311 and further extends into or within opening 300 to contact conductive material 41. In one embodiment, semiconductor die 36 includes a die top side 37, an opposing die bottom side 38, and a die sidewall 39 located between die top side 37 and die bottom side 38. In the present embodiment, die sidewall 39 defines a die perimeter for semiconductor die 36. In one embodiment, the die perimeter defined by die sidewall 39 is inside or within the die perimeter defined by die sidewall 19 of semiconductor die 16 as generally presented in FIGS. 1 and 2.

In some embodiments, die top side 37 can be defined by a conductive layer 370. In other embodiments, die top side 37 can be defined by one or more dielectric layers and one or more conductive layers, which are interconnected to device regions (not shown), disposed within and/or on semiconductor die 36. In some embodiments, die bottom side 38 can be defined by a conductive layer 380. In some embodiments, semiconductor die 36 can be a power semiconductor device, such as an insulated gate field effect transistor (IGFET) device, an insulated gate bipolar transistor (IGBT) device, a bipolar transistor device, a diode device, other power devices, or other semiconductor devices as known to those skilled in the art. In the present embodiment, semiconductor die 36 is illustrated as an IGFET and further includes a control electrode 61 electrically connected to a lead 14 using a conductive connective structure 29, such as a conductive wire 29 as generally illustrated in FIG. 2.

A clip 51 is attached adjacent to, atop, or to die top side 37 of semiconductor die 36 using a conductive material 61 or a conductive layer 61. In some embodiments, conductive material 61 is a conductive solder, such as a solder paste. In some embodiments, clip 51 includes a clip tail section 510 and a clip top section 511 connected to clip tail section 510. In most embodiments, clip tail section 510 extends away from clip top section 511 at a selected bend angle 54 for connecting clip tail section 510 to at least one of leads 14. In most embodiments, clip tail section 510 is attached or connected to lead top surface 140 using a conductive attach material 55. In accordance with the present embodiment, clip 51 includes one or more inspection features 301, openings 301, or inspection ports 301 disposed to extend completely through clip top section 511 such that conductive material 61 can be monitored, viewed, or inspected through the inspection features 301. In some embodiments, clips 31 and 51 comprise copper, a copper alloy, or other materials known to those skilled in the art. In some embodiments, clips 31 and 51 include one or more mote features 63 disposed to extend partially into clips 31 and 51 from an upper surface and/or from a lower surface of the clips. Mote features 63 can be provided, for example, as solder wick features for electronic component 10.

Figure 9:
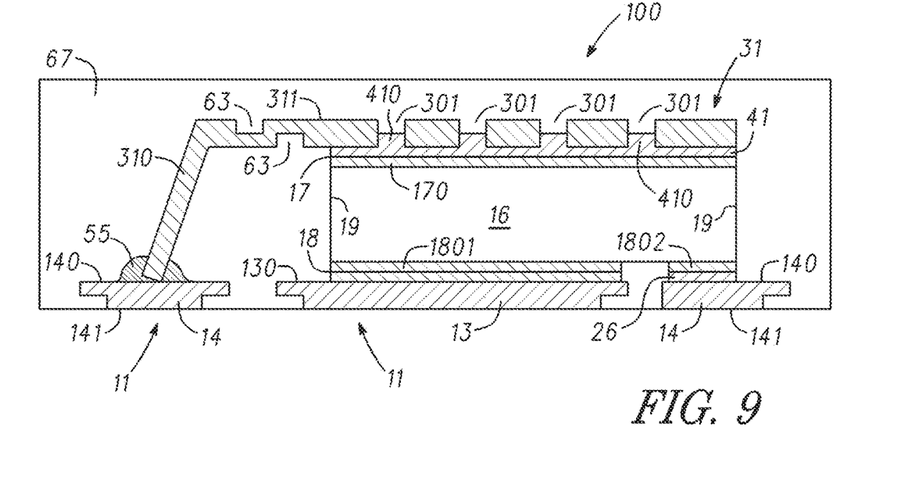
FIG. 9 illustrates a cross-sectional side view of an electronic component having inspection features in accordance with another embodiment of the present invention.
Figure 11:
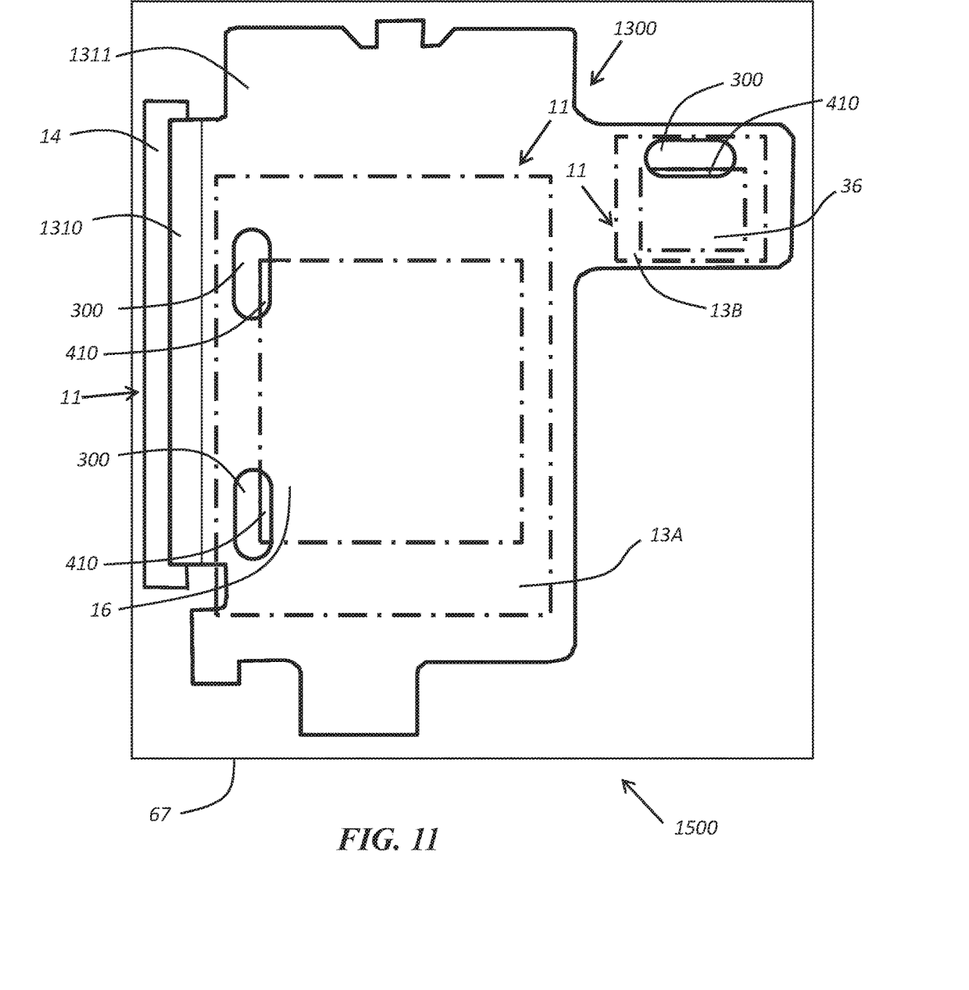
FIG. 11 illustrates a top plan view of an electronic component having inspection features in accordance with an embodiment of the present invention.

Electronic component 10 further includes a package body 67, an encapsulating layer 67, a molded package body 67, or an encapsulant 67, which covers or encapsulates semiconductor die 16, semiconductor die 36, clip 31, clip 51, and at least portions of leadframe 11. In the present embodiment, lead bottom surface 141 and die pad bottom surface 131 are exposed to the outside of package body 67 and are adapted for attaching to a next level of assembly, such as a printed circuit board. In some embodiments, package body 67 can be polymer based composite material, such as epoxy resin with filler, epoxy acrylate with filler, or polymer with proper filler. Package body 67 comprises a non-conductive and environmentally protective material that protects semiconductor die 16 and semiconductor die 36 from external elements and contaminants. Package body 67 may be formed using paste printing, compressive molding, transfer molding, over-molding, liquid encapsulant molding, vacuum lamination, other suitable applicator processes, or other processes as known to those skilled in the art. In some embodiments, package body 67 is an epoxy mold compound (EMC) and can be formed using transfer or injection molding techniques. In some embodiments, die pad 13 and lead 14 can be provided with recessed portions 134 as generally illustrated in FIG. 1 to provide locking features for enhancing the adhesion of package body 67 to leadframe 11 In addition, mote features 63 can also promote adhesion between clips 31 and 51 and package body 67. In accordance with the present embodiment, package body 67 extends into, or is disposed to be within, inspection features 301 and exposed portions (e.g., those portions not covered by semiconductor die 36) of inspection features 300 to physically contact conductive material 61 and exposed portions of conductive material 41. Electronic component 10 is an example of a stacked die configuration where a plurality of clips with inspection ports is used and with a plurality of semiconductor die. Examples of unstacked configurations are illustrated in FIGS. 9 and 11 described later.

Figure 3:
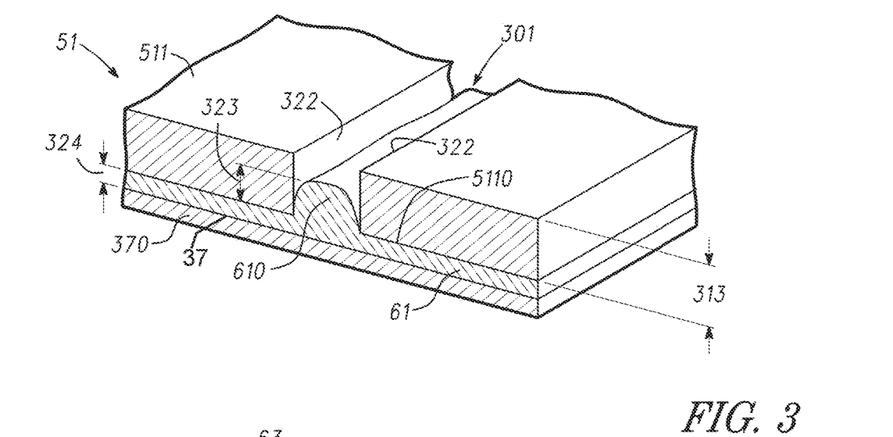
FIG. 3 illustrates a perspective and cross-sectional view of part of a clip structure having an inspection feature in accordance with an embodiment of the present invention.

With reference to FIG. 3, which is a perspective and cross-sectional view of part of clip top section 511 of clip 51 having inspection port 301 or opening 301, features of the present embodiment will now be described. In accordance with the present embodiment, after conductive material 61 is heat-treated using, for example, a solder reflow process, conductive material 61 advantageously extends upward or away from die top side surface 37 of semiconductor die 36. Thus, conductive material 61 at least partially covers interior surfaces 322 of opening 301 such that conductive material 61 has a height 323 within opening 301 with respect to a bottom surface 5110 of clip top section 511. In one embodiment, height 323 is greater than about 5 microns when conductive material 61 has a bond line thickness 324 (BLT) between bottom surface 5110 and a die top side 37 of about 25 microns or more. Stated another way, after a reflow process, conductive material 61 forms a conductive fillet 610 or a solder fillet 610 inside of opening 301. In some embodiments, solder fillet 610 has a dome-like shape in a cross-sectional view as generally illustrated in FIG. 3. In some embodiments, clip top section 511 has a thickness 313 greater than about 100 microns. In another embodiment, thickness 313 is in range from about 100 microns through about 300 microns. In a further embodiment, thickness 313 is about 250 microns.

In accordance with the present embodiment and as illustrated in FIG. 3, inspection port 301 is configured to determine coverage of conductive material 61 below clip top section 511 or between die top side 37 and clip top section 511. In accordance with the present embodiment, conductive material 61 forms conductive fillet 610 within inspection port 301 based on bond line thickness 324 and the size and shape of inspection port 301. The type of material used for conductive material 61 can affect the volume of conductive material for fillet formation, but in practice, it was found that conductive fillet 610 or solder fillet 610 will form in inspection opening 301 when good conductive material coverage exists between clip top section 511 and die top side 37. For example, in the case of a solder material, such as Sn5Pb92.5-Type 3, an inspection port 301 of dimension 600 microns by 250 microns, and a clip top section 511 thickness of about 200 microns, a typical solder fillet 610 has been observed having approximately 75% the width of the inspection port, or 188 microns in width, 600 microns in length, and a thickness greater than about 5 microns. In some embodiments, it was found that a height 323 of greater than about 5 microns is sufficient for detection by microscope, and a height 323 of at least about 50 microns to about 100 microns is sufficient commercially available automated optical inspection equipment. It was further found in practice that height 323 can be a function of the thickness 313 of clip 51, but a thickness in a range from greater than about 100 microns to about 300 microns is appropriate for thickness 313. In accordance with the present embodiment, inspection ports 300 and 301 uniquely enable automatic inspection of solder coverage or conductive material coverage, which improves manufacturability of electronic components using clips including electronic components having stacked and small footprint semiconductor die, such as IGFET die.

Figures 4, 5:
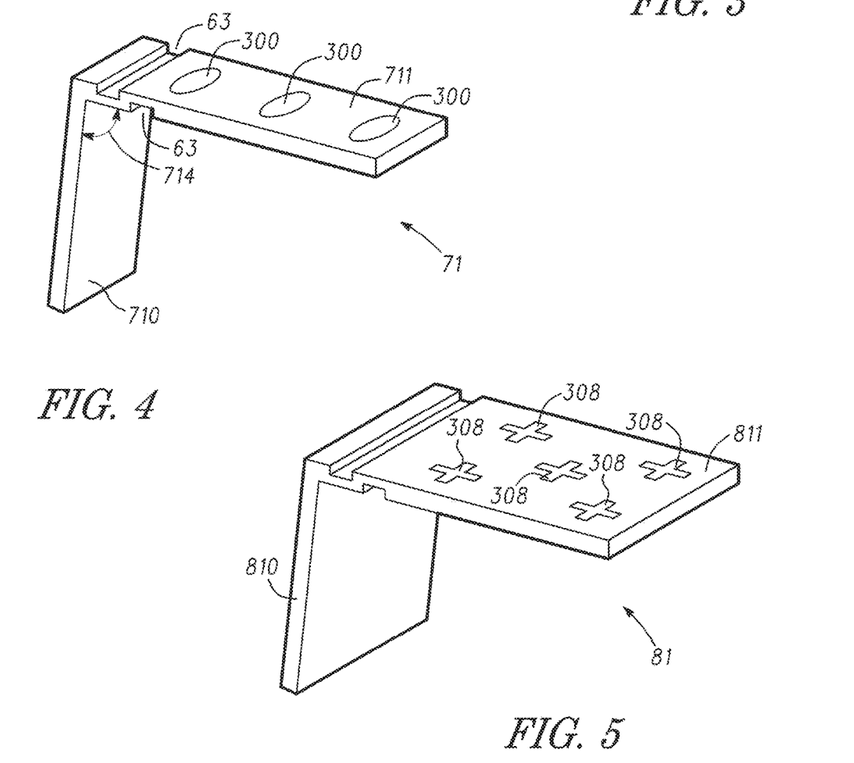
FIG. 4 illustrates a perspective view of a clip structure having inspection features in accordance with an embodiment of the present invention.
FIG. 5 illustrates a perspective view of a clip structure having inspection features in accordance with an embodiment of the present invention.

FIG. 4 illustrates a perspective view of a clip 71 having one or more inspection features 300 in accordance with an embodiment of the present disclosure. Similar to clips 31 and 51, clip 71 includes a clip tail section 710 and a clip top section 711 connected to clip tail section 710. In the present embodiment, clip tail section 710 extends away from clip top section 711 at a selected a bend angle 714 for connecting clip tail section 710 to one or more leads 14. In one embodiment, clip 71 includes one or more moat features 63 disposed to partially extend into clip top section 711 from one or more sides of clip top section 711. In some embodiments, clip 71 comprises copper or a copper alloy. Inspection features 300 can be formed using a removal process. In some embodiments, chemical etching using an etchant, such as ferric chloride, ammonium phosphate, and/or CuClAHAS (Copper Chloride in Aqueous Hydrochloric Acid Solution) can be used. In other embodiments, laser etching, such as a LEEP process (Laser Evolved Etching Process) with LDI (Laser Defined Imaging) can be used. Alternatively, inspection features 300 can be formed mechanically, for example, by punching, ablating, sawing, water jetting, and/or grinding the clips. Inspection features 300 enable the inspection of conductive material coverage for clip-to-electronic component configurations. Among other things, this technique facilitates a reduction in voiding defects going undetected and improves coverage of the conductive material between the semiconductor die and the clip. In power semiconductor device applications, this reduces resistance of the device. Further, inspection ports 300 enable automatic inspection of conductive material coverage without requiring substantial changes to clip designs. Inspection ports 300 are adapted for detection by inspection techniques including, for example, X-Ray inspection and Confocal Scanning Acoustic Microscopy (C SAM) inspection.

Figure 6A:
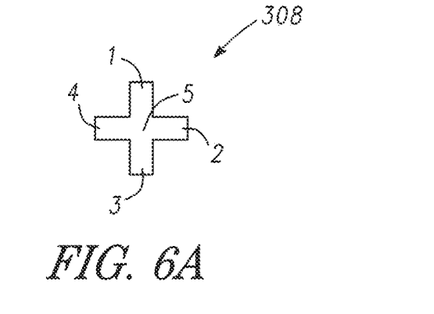
FIGS. 6A and 6B illustrate top views of inspection features of FIG. 5 in accordance with embodiments of the present invention.
Figure 6B:
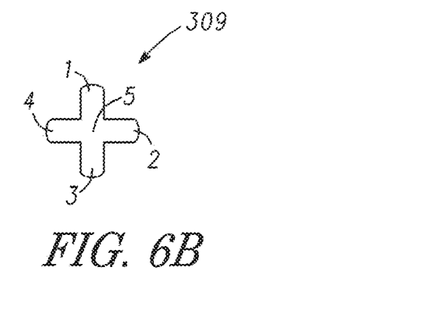

FIG. 5 illustrates a perspective view of a clip 81 having inspection features 308, inspection ports 308, or openings 308 in accordance with another embodiment. Similar to clips 31, 51, and 71, clip 81 includes a clip tail section 810 and a clip top section 811 connected to clip tail section 810. In accordance with the present embodiment, inspection features 308 are configured as cross-point inspection features, which have a cross-shape in plan view. In the present embodiment, inspection features 308 are distributed at intervals across the primary surface of clip top section 811. In another embodiment, a single inspection feature 308 is used. FIGS. 6A and 6B are top plan views of embodiments of cross-point inspection features 308 and 309 respectively. As illustrated, inspection feature 308 has squared-off ends and inspection feature 309 has a rounded ends. These shapes can be achieved using stamping and/or etching techniques when forming inspection features 308 and 309. It is understood that combinations of rounded and squared-off ends can be used within a single inspection features, or some inspection features can squared-off ends and other can have rounded ends on the same clip top section. With reference to FIGS. 6A and 6B, inspection features 308 and 309 are adapted to provide a five-point inspection feature, which allows inspections at the four edge or corner portions and one at the intersection or center portion. The size of inspection features 308 and 309 can be modified in accordance with the properties of the conductive material used to attach clip 81, the characteristics of the reflow process, and the size of clip 81. This applies as well to clips 31, 51, and 71.

Figure 7:
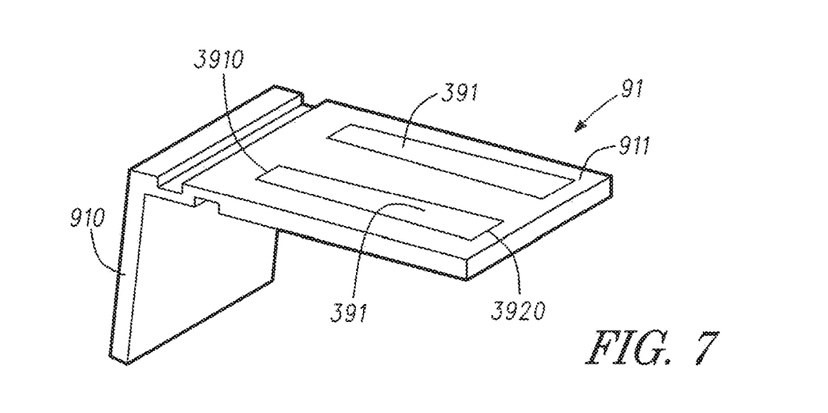
FIG. 7 illustrates a perspective view of a clip structure having inspection features in accordance with an embodiment of the present invention.

FIG. 7 illustrates a perspective view of a clip 91 having inspection features 391, inspection ports 391, or openings 391 in accordance with another embodiment. Similar to clips 31, 51, 71, and 81, clip 91 includes a clip tail section 910 and a clip top section 911 connected to clip tail section 910. In accordance with the present embodiment, inspection features 391 are configured as slots with narrowing shapes such that one end 3910 is narrower than an opposing end 3920. In this embodiment, the narrowing shape or feature of inspection features 391 can be used for characterizing a solder deposition process as well as for a reflow monitor or set-up test vehicle. In addition, inspection features 391 can be used as view ports for monitoring solder coverage in production devices. The narrowing shape of inspection features 391 can be reversed to what is presented in FIG. 7 or can be provided as a pair in opposing directions. The formation of the solder fillet within inspection features 391 depends on the reflow profile used, the solder type, the thickness of clip 91, and the thickness of solder applied for attaching conductive clip 91 to semiconductor die 16 or 36. In some embodiments, the size of opposing angles at the ends of inspection ports 391 is one important feature. By having the wide-narrow ends reversed or flipped, the conductive material or solder will wet and wick at the extremes of inspections ports 391 consistent with the amount of conductive material or solder that is present. In this way, the coverage and sufficient quantity of solder are verified as well as solder voiding detected. In some embodiments, by varying the amount of conductive material or solder during set-up across multiple device samples, the final quantity of conductive material or solder and the reflow profile can be determined and applied prior to production to ensure optimum solder coverage and performance of the process.

Figure 8:
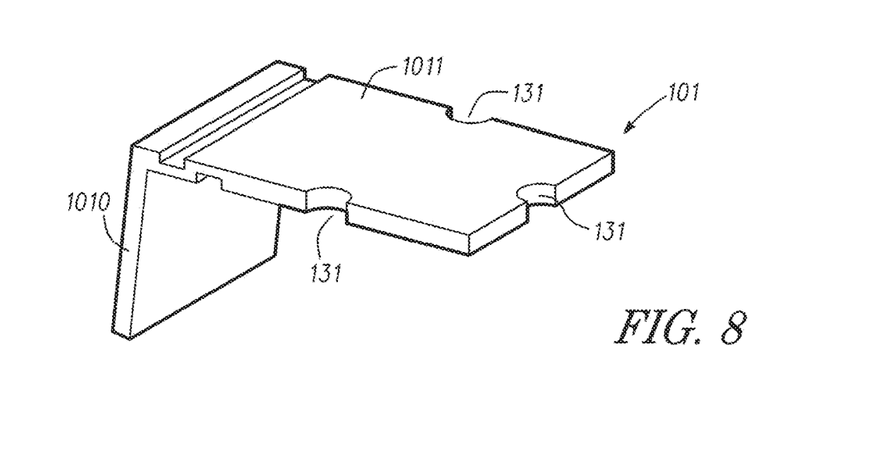
FIG. 8 illustrates the perspective view of a clip structure having inspection features in accordance with an embodiment of the present invention.

FIG. 8 illustrates a perspective view of a clip 101 having inspection features 131, openings 131, edge serrations 131, or notches 131 in accordance with a further embodiment. Similar to clips 31, 51, 71, 81, and 91, clip 101 includes a clip tail section 1010 and a clip top section 1011 connected to clip tail section 1010. In accordance with the present embodiment, notches 131 are disposed around exterior edges of clip top section 1011 at different locations. In some embodiments, the locations can be determined based on the size of the solder attach area of semiconductor die 16 or 36. The height of the solder fillet formation along a sidewall surface 132 of notch 131 will be indicative of a proper BLT and coverage of the solder material between clip top section 1011 and semiconductor die 16 or 36. That is, the presence of the solder fillet corresponds to proper coverage of the solder material. This solder fillet can be inspected using automated inspection equipment. Notches 131 can be formed during formation of clip 101 using, for example, a stamping technique, an etching technique, or other techniques as known to those skilled in the art.

FIG. 9 illustrates a cross-sectional side view of an electronic component 100, such as a semiconductor package 100, semiconductor device 100 or a packaged semiconductor device 100, having inspection features 301 in accordance with another embodiment. Electronic component 100 is an example of an unstacked configuration compared to the stacked configuration of electronic component 10 described previously. In the present embodiment, semiconductor die 16 is attached to leadframe 11 in a different configuration. In the present embodiment, semiconductor die 16 is presented as an IGFET device having a source electrode 1801 attached to die pad top surface 130 and a gate electrode 1802 attached to lead top surface 140 of one of leads 14 in a flip-chip configuration. In this configuration, conductive electrode 170, which is a drain electrode in the present embodiment, is facing away from die pad top surface 130 to place semiconductor die 16 in what is referred to as a "drain up" configuration. Source electrode 1801 and gate electrode 1802 can be attached to die pad 13 and lead 14 respectively using, for example, conductive attach layer 26 as described previously. In the present embodiment, clip 31 having clip top section 311 and inspection ports 301 or openings 301 is attached to conductive electrode 170 using conductive material 41, which forms conductive fillets 410 or solder fillets 410 within inspection features 301 similar to solder fillets 610 described previously. Clip 31 further includes clip tail section 310 connected to clip top section 311. Clip tail section 310 extends away from clip top section 311 at a selected bend angle for connecting clip tail section 310 to at least one of leads 14. In one embodiment, clip tail section 310 is attached to lead top surface 140 of lead 14 using conductive attach material 55.

Electronic component 100 further includes package body 67, which encapsulates or covers semiconductor die 16, clip 31, and portions of leadframe 11. In the present embodiment, lead bottom surfaces 141 and die pad bottom surface 131 are exposed to the outside of package body 67. In accordance with the present embodiment, inspection ports 301 are configured for determining or inspecting coverage of conductive material 41 below clip top section 311 or between die top side 17 and clip top section 311. In accordance with the present embodiment, the presence of conductive fillet 410 within openings 301 is indicative of sufficient coverage. In accordance with the present embodiment, package body 67 is disposed within inspection ports 301 and physically contacts solder fillets 410, which at least partially cover interior surfaces of inspection ports 301.

Figure 10:
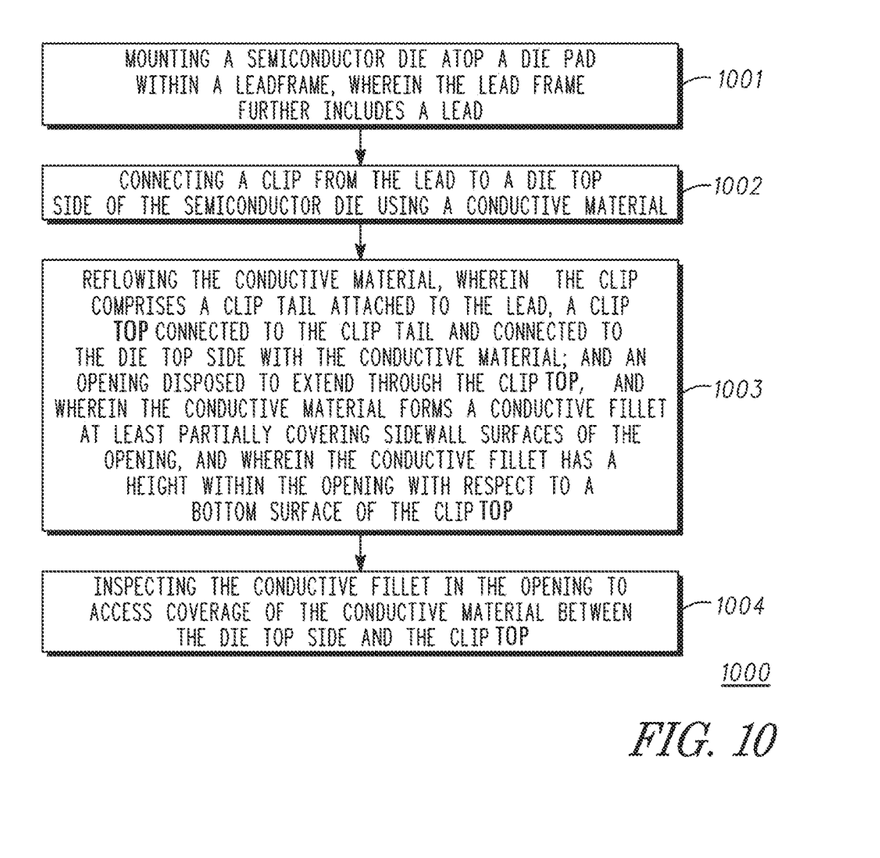
FIG. 10 presents a flowchart of a method for providing an electronic component in accordance with embodiments of the present invention.

FIG. 10 presents a flowchart of a method 1000 for providing an electronic component. In some embodiments, the electronic component of method 1000 can be similar to one or more of electronic components 10, 100, and/or 1500 presented in FIGS. 1, 9 and 11 herein, or to variations or combination thereof.

Block 1001 of method 1000 comprises mounting a semiconductor die atop a die pad within a leadframe, wherein the leadframe further includes a lead. For instance, the semiconductor die can be similar to semiconductor die 16 as mounted atop die pad 13 of leadframe 11, which includes a lead 14 as presented in FIGS. 1 and 2. As another example, the semiconductor die can be similar to semiconductor die 16 as mounted to leadframe 11 in a drain-up configuration with multiple terminals (e.g., source electrode 1801 and gate electrode 1802) connected to leadframe 11. The leadframe of block 1001 can be similar to leadframe 11 of FIGS. 1, 2, and 9, and can include recessed portions 134 are presented in FIG. 1. As a further example, the semiconductor die can similar to semiconductor die 16 or semiconductor die 36 mounted atop die pads 13A and 13B of leadframe 11 as presented in FIG. 11.

Block 1002 of method 1000 comprises connecting a clip from the lead to a die top side of the semiconductor die using a conductive material. For instance, the clip can be similar to clips 31 and 51 illustrated in FIGS. 1, 2, and 9. In some implementations, the clip can be similar to clip 71 presented in FIG. 4, clip 81 presented in FIG. 5, clip 91 presented in FIG. 7, clip 101 presented in FIG. 8, clip 1300 presented in FIG. 11, variations thereof, or combinations thereof. The conductive material can be similar to conductive materials 41 and 61, and in some embodiments comprises a solder paste provided using a printing or dispensing process. Lead-free solders can be used, for example, such as tin/silver or tin/silver/copper solders. In some embodiments, the clip comprises a conductive material, such as copper or a copper alloy. In some embodiments, the clip has a thickness in a range from about 100 microns through about 300 microns. In one embodiment, the clip has a thickness of about 250 microns and comprises copper.

Block 1003 of method 1000 comprises reflowing the conductive material. In this block, after the clip is attached with the conductive material in block 1002, the sub-assembly including the leadframe, semiconductor die, conductive material, and clip is subjected to controlled heating, which melts the conductive material. This provides a permanent interconnect between the semiconductor die and the clip and, in some embodiments, a permanent interconnect between the semiconductor die and the leadframe for example, if not formed previously. Heating may be done using a reflow oven, an infrared lamp system, or using a heated gas. In some embodiments, the conductive material can have a bond line thickness 324 of about 25 microns or more as presented, for instance, with FIG. 3.

Block 1003 of method 1000 further describes that the clip comprises a clip tail section attached to the lead and a clip top section connected to the clip tail section and connected to the die top side with the conductive material. For instance, the clip tail section can be similar to clip tail sections 310 and 510 presented in FIGS. 1, 2, and 9. For instance, the clip top section can be similar to clip top sections 311 and 511 presented in FIGS. 1, 2, 3, and 9. In the alternative, the clip top section can be similar to clip top section 711 presented in FIG. 4, clip top section 811 presented in FIG. 5, clip top section 911 presented in FIG. 7, clip top section 1011 presented in FIG. 8, clip top section 1311 presented in FIG. 11, variations thereof, or combinations thereof. The clip top section is connected to for instance, die top side 17 or 37 as presented in FIGS. 1 and 9. In some embodiments, the die top side is the side of the semiconductor die that is opposite to the die pad. Stated another way, the die top side can be that side the semiconductor die that is attached to the clip top section.

Block 1003 of method 1000 also describes the clip having an opening disposed to extend through the clip top section, and the conductive material forming a conductive fillet at least partially covering sidewall surfaces of the opening. For instance, the opening can be similar to inspection ports 300 and 301 or openings 300 and 301 presented in FIGS. 1, 2, 3, 4, 9 and 11. In the alternative, the opening can be similar to inspection ports or cross-shape openings 308 and 309 presented in FIGS. 5, 6A, and 6B, inspection ports or openings 391 presented in FIG. 7, openings, edge serrations, or notches 131 presented in FIG. 8, variations thereof, or combinations thereof. In some embodiments, the opening can be disposed inward from edge of the clip top section, as presented, for example, in FIGS. 1, 2, 3, 4, 5, 6, 7, 9, and 11. In other embodiments, the opening is disposed adjoining an edge of the clip top section as presented, for example, in FIG. 8. In further embodiments, the opening can be disposed to partially overlap the die top side surface as presented, for example, in FIG. 11.

The conductive fillet can be similar to conductive fillets 410 and 610 presented, for example, in FIGS. 1, 3, 9, and 11. Block 1003 also describes the conductive fillet having a height within the opening with respect to a bottom surface of the clip top section. The height can be similar to height 323 presented in FIG. 3, which is further presented with respect to bottom surface 5110 of clip top section 511. In some embodiments, the height is greater than or equal to about 5 microns, which in practice was found to be sufficient for automatic inspection equipment. In accordance with the present embodiment, the presence of the conductive fillet is indicative of sufficient coverage.

Block 1004 of method 1000 comprises inspecting the conductive fillet in the opening to assess coverage of the conductive material between the die top side and clip top section. Inspecting can be done using, for example, using a microscope or an automatic optical inspection (AOI) equipment. Such equipment can include one or more cameras that autonomously scan the openings to inspect the conductive fillets formed within the opening(s). After Block 1004, the sub-assembly can be encapsulated to form package body 67.

FIG. 11 presents a top plan view of an electronic component 1500, such as a semiconductor package 1500, a semiconductor device 1500, or a packaged semiconductor device 1500 having inspections features 300 in accordance with another embodiment. In some embodiments, electronic component 1500 comprises a semiconductor leadframe-based package configured, for example, for high-power and/or high-current requirements.

Electronic component 1500 is similar to electronic components 10 and 100 and only the key differences will be described hereinafter. Electronic component 1500 is an example embodiment where a single or common clip 1300 is configured to attach to more than one electronic die. For example, as presented in FIG. 11, clip 1300 is connected or attached to semiconductor device 16, which is attach to a die pad 13A of substrate 11 or leadframe 11, and is further connected or attached to semiconductor device 36, which is attached to another die pad 13B of substrate 11 or leadframe 11. Stated a different way, electronic component 1500 is an example of an embodiment where semiconductor device 16 and semiconductor device 36 are laterally spaced apart in a side-by-side configuration and are connected together with a common clip 1300. By way of example, electronic component 1500 can be a configuration where semiconductor device 16 comprises a low-side IGFET device and semiconductor device 36 comprises a high-side IGFET device. It is understood that not all of the interconnects are illustrated in FIG. 11 so as to not crowd the drawing and to better illustrate the features of clip 1300.

Clip 1300 includes a clip top section 1311 connected to semiconductor device 16 and connected to semiconductor device 36 using, for example, a conductive material, such as conductive material 41 illustrated in FIG. 1. Clip 1300 further includes a clip tail section 1310 connected to clip top section 1311, which is further connected to a lead 14 using, for example, conductive attach material, such as conductive attach material 55 as illustrated in FIG. 1. In accordance with the present embodiment, clip 1300 includes one or more inspection features, 300, openings 300, or inspection ports 300 disposed to extend completely through clip top section 1311 such that the conductive material used to attach clip 1300 to semiconductor devices 16 and 36 (e.g., conductive material 41) can be monitored, viewed, or inspected through the inspection features 300. In one embodiment, inspection features 300 are disposed within clip top section 1311 so that inspection features 300 partially overlap semiconductor die 16 and semiconductor die 36 as generally illustrated in FIG. 11. In this configuration, inspection features 300 facilitate the inspection of conductive fillets 410 that form within inspection features 300 where inspection features 300 overlap the die top side surfaces of semiconductor die 16 and semiconductor die 36 before the sub-assembly is encapsulated to form package body 67. In addition, inspection features 300 can further facilitate the inspection of solder overhang or wick-over defects, which can cause electrical shorting, and to ensure that one or more of semiconductor devices 16 and 36 have not shifted or twisted during the reflow process. In other embodiments, additional inspection features 300 can be placed directly overlying one or more of semiconductor device 16 and/or 36. It is understood that the placement of inspection features 300 illustrated with electronic component 1500 can be used with the other embodiments described herein.

In summary, the inspection features disclosed and described herein are adapted as part of an assembly of an electronic component to allow inspection of conductive material coverage or solder coverage after heat treatment or a reflow process. The present embodiments provide reliable and repeatable data indicative of solder coverage by forming a measurable solder or conductive fillet disposed within the inspection features. The inspection features are cost effective to add to the clips, which can be added during clip manufacture using stamping, etching, or other techniques. The inspection ports are further adapted to reduce process development by substantially eliminating failure analysis studies to validate solder coverage based on process window characterization, which in prior practice could require complex and time-consuming experimentation. In addition, the inspection ports enable the use of AOI equipment to assess more accurately solder coverage using the inspection features. The shapes of the inspection ports are adaptable to different clip designs and solder types. Further, the inspection ports improve electronic component quality and reduce manufacturing costs. By enabling the use of AOI equipment, an enhanced ability to inspect for proper solder coverage is provided compared to prior X-Ray techniques. Finally, the inspection ports further reduce costs by reducing development time for new solder systems and by reducing the consumption of materials during the development and/or characterization process.

In all of the configurations disclosed herein, the inspection ports can also facilitate the inspection of a solder fillet that forms between the bottom surface of the electronic die and the substrate. This can beneficial, for example, for thin electronic die (for example, less than or equal to about 250 microns thick) where excessive bottom solder fillet might overlap onto the top surface of the electronic die thereby creating a leakage path leading to high voltage shorting. In some embodiments, a further benefit is provided by positioning the inspection ports at the die corners, for example, as illustrated in FIG. 11. This enables observation of the solder fillets for both top and bottom surfaces in the die corners where solder voiding is known to occur more frequently.

In view of all of the above, it is evident that a novel structure and method for making electronic devices, such packaged semiconductor devices, with improved reliability have been disclosed. Included, among other features, are a clip having one or more inspection features extending through a clip top section of the clip. Conductive material used to attach the clip top section to a semiconductor die forms a conductive fillet within the opening, which is adapted for visual inspection and for determining the sufficiency of coverage of the conductive material between the semiconductor die and the clip top section. This is an improvement over prior X-Ray techniques and extensive process characterization techniques.

As stated herein, the scope of the present disclosure is not limited to the specific example method blocks (or associated structures) discussed. For example, various blocks (or portions thereof) may be removed from or added to the example method 1000, various blocks (or portions thereof) may be reordered, various blocks (or portions thereof may be modified), etc.

While the subject matter of this disclosure is described with specific preferred embodiments and example embodiments, the foregoing drawings and descriptions thereof depict only illustrative embodiments of the subject matter, and are not therefore to be considered limiting of its scope. It is evident that many alternatives and variations will be apparent to those skilled in the art. For instance, other embodiments include single electronic chip implementations and implementations including more than two electronic chips. Additionally, more or less than the number of openings illustrated may be used including a single opening as well as a plurality of openings. Further, the openings may be placed at various locations on the clip top section.

In addition, the structures and elements described herein can be used with other substrate types. Although the present description primarily uses a QFN/MLF or QFP leadframe substrate for illustrative purposes, it is understood that applying these concepts to other leadframe substrates, such as routable-MLF (RtMLF) or molded interconnect system (MIS), as well as to laminate substrate design, is possible while providing the same or similar benefits. In the case of a laminate design, a leadframe may still be utilized to enable the conductive leadfinger formation and interconnect to the device mounted on a laminate substrate.

As the claims hereinafter reflect, inventive aspects may lie in less than all features of a single foregoing disclosed embodiment. Thus, the claims hereinafter expressed are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

What is claimed is:

1. A method for manufacturing an electronic device structure, comprising:
    providing a substrate comprising:
        a die pad having a die pad top surface and an opposing die pad bottom surface;
        a lead spaced apart from the die pad and having a lead top surface and an opposing lead bottom surface;
    connecting a first semiconductor die to the die pad top surface, wherein the first semiconductor die comprises:
        a first die top side;
        a first die bottom side connected to the die pad top surface; and
        a first die sidewall, located between the first die top side and the first die bottom side, and defining a first die perimeter; and
    connecting a first clip to the first die top side with a first conductive material and to the lead, wherein the first clip comprises:
        a first clip tail section connected to the lead;

a first clip top section coupled to the first clip tail section and connected to the first die top side with the first conductive material; and a first opening disposed to extend through the first clip top section, wherein the first opening overlaps at least a portion of the first conductive material so that the first conductive material is visible in the first opening.

2. The method of claim 1, wherein:

connecting the first clip to the first die top side comprises reflowing the first conductive material so that after the step of reflowing:

the first conductive material extends upward from the first die top side to at least partially cover interior surfaces of the first opening such that the first conductive material has a first height within the first opening with respect to a bottom surface of the first clip top section.

3. The method of claim 2, wherein:

after the step of reflowing:

the first height is greater than about 5 microns; and an upper surface of the first conductive material within the first opening has a dome-like shape in a cross-sectional view.

4. The method of claim 1, wherein:

connecting the first clip to the first die top side with the first conductive material comprises connecting with a solder material; and connecting the first clip comprises connecting the first clip comprising a first clip top section having a thickness greater than about 100 microns.

5. The method of claim 1, further comprising:

providing a second semiconductor die comprising:

a second die top side;

a second die bottom side; and a second die sidewall, located between the second die top side and the second die bottom side, and defining a second die perimeter; and electrically coupling the second semiconductor die to the substrate.

6. The method of claim 5, wherein:

connecting the first clip comprises connecting the first clip top section to the second die top side with the first conductive material; and the first clip further comprises a second opening disposed to extend through the first clip top section proximate to the second die top side, wherein after the step of connecting the first clip:

the first conductive material extends upward from the second die top side to at least partially cover interior surfaces of the second opening such that the first conductive material has a second height within the second opening with respect to a bottom surface of the first clip top section.

7. The method of claim 5, further comprising:

connecting the second die bottom side adjacent to the first clip top section such that at least a portion of the first opening is uncovered by the second semiconductor die; and connecting a second clip to the second die top side with a second conductive material and to a second lead, wherein the second clip comprises:

a second clip tail section connected to the second lead;

a second clip top section coupled to the second clip tail section and attached to the second die top side with the second conductive material; and a second opening disposed to extend through the second clip top section and overlapping at least a portion of the second conductive material; and providing a package body encapsulating the first semiconductor die, the second semiconductor die, the first clip, and the second clip, wherein:

the package body physically contacts the second conductive material within the second opening.

8. The method of claim 7, wherein:

connecting the second clip comprises reflowing the second conductive material so that after the step of reflowing:

the second conductive material extends upward from the second die top surface to at least partially cover interior surfaces of the second opening.

9. The method of claim 1, wherein:

connecting the first clip includes providing the first opening comprising a pair of opposing ends where one end is narrower than an opposite end.

10. The method of claim 1, wherein:

connecting the first clip includes providing the first opening comprising a cross-shape.

11. A method of forming an electronic device structure comprising:

providing a lead frame comprising:

a die pad having a die pad top surface and an opposing die pad bottom surface; and a lead spaced apart from the die pad and having a lead top surface and an opposing lead bottom surface;

connecting a first semiconductor die to the lead frame, wherein the first semiconductor die comprises:

a first die first side;

a first die second side connected to the die pad top surface; and a first die sidewall, located between the first die first side and the first die second side, and defining a first die perimeter; and connecting a first clip to the first semiconductor die with a first conductive material and to the lead, wherein the first clip comprises:

a first clip tail section coupled to the lead top surface;

a first clip top section coupled to the first clip tail section and connected to the first die first side with the first conductive material; and a first opening disposed to extend through the first clip top section, wherein the first opening laterally overlaps at least a portion of the first conductive material.

12. The method of claim 11, wherein:

connecting the first clip to the first semiconductor die comprises reflowing the first conductive material comprising a solder material; and after the connecting step:

the first conductive material forms a first conductive fillet at least partially covering sidewall surfaces of the first opening;

the first conductive fillet has a first height within the first opening with respect to a bottom surface of the first clip top section; and an upper surface of the first conductive fillet has a dome-like shape in a cross-sectional view.

13. The method of claim 11, wherein:

connecting the first clip includes providing the first opening disposed inward from edges of the first clip top section; and the first opening is configured to reduce voiding of the first conductive material during the step of connecting the first clip.

14. The method of claim 11, wherein:
connecting the first clip includes providing the first opening disposed adjoining an edge of the first clip top section.

15. The method of claim 11, further comprising:
providing a second semiconductor die comprising:
   a second die first side;
   a second die second side; and
   a second die sidewall, located between the second die first side and the second die second side, and defining a second die perimeter;
connecting the second die second side adjacent to the first clip top section such that at least a portion of the first opening is uncovered by the second semiconductor die;
connecting a second clip to the second semiconductor die with a second conductive material and to a second lead, wherein the second clip comprises:
   a second clip tail section connected to the second lead;
   a second clip top section coupled to the second clip tail section and connected to the second die first side with the second conductive material; and
   a second opening disposed to extend through the second clip top section and overlapping at least a portion of the second conductive material; and
providing a package body encapsulating the first semiconductor die, the second semiconductor die, the first clip, and the second clip, wherein:
   the package body physically contacts the second conductive material within the second opening.

16. The method of claim 15, wherein:
connecting the second clip comprises reflowing the second conductive material comprising a solder material so that after the step of reflowing:
   the second conductive material forms a second conductive fillet at least partially covering interior surfaces of the second opening; and
   the second conductive fillet has a second height within the second opening with respect a bottom surface of the second clip top section;
   the second height is greater than about 5 microns; and
   an upper surface of the second conductive fillet has a dome-like shape in cross-sectional view.

17. A method for forming an electronic device structure, comprising:
mounting a first semiconductor die atop a die pad within a lead frame, wherein the lead frame further includes a lead;
coupling a clip from the lead to a die top side of the first semiconductor die using a first conductive material; and
reflowing the first conductive material, wherein:
   the first clip comprises:
     a first clip tail section coupled to the lead;
     a first clip top section coupled to the first clip tail section and coupled to the die top side with the first conductive material; and
     a first opening disposed to extend through the first clip top section, wherein:
       the first opening laterally overlaps at least a portion of the first conductive material and is configured to reduce voiding of the first conductive material during the reflowing step;
       the first conductive material forms a first conductive fillet at least partially covering sidewall surfaces of the first opening; and
       the first conductive fillet has a first height within the first opening with respect to a bottom surface of the first clip top section.

18. The method of claim 17, further comprising:
inspecting the first conductive fillet in the first opening to assess coverage of the first conductive material between the die top side and the first clip top section; and
thereafter forming a package body encapsulating the first semiconductor die and the clip.

19. The method of claim 17, wherein:
connecting the first clip comprises providing the first opening comprising a first pair of opposing ends where one end of the first pair is narrower than an opposite end of the first pair.

20. The method of claim 19, wherein:
connecting the first clip comprises providing a second opening extending disposed to extend through the first clip top section, the second opening comprising a second pair of opposing ends where one end of the second pair is narrower than an opposite end of the second pair.

* * * * *